(12) United States Patent
Kosaka et al.

(10) Patent No.: US 9,627,300 B2
(45) Date of Patent: Apr. 18, 2017

(54) AMPLIFIER PACKAGE WITH MULTIPLE DRAIN BONDING WIRES

(71) Applicant: Mitsubishi Electric Corporation, Tokyo (JP)

(72) Inventors: Naoki Kosaka, Tokyo (JP); Shohei Imai, Tokyo (JP); Atsushi Okamura, Tokyo (JP); Shinichi Miwa, Tokyo (JP); Kenichiro Chomei, Tokyo (JP); Yoshinobu Sasaki, Tokyo (JP); Kenichi Horiguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/156,596

(22) Filed: May 17, 2016

(65) Prior Publication Data
US 2017/0077012 A1   Mar. 16, 2017

(30) Foreign Application Priority Data
Sep. 16, 2015  (JP) .................................. 2015-182446

(51) Int. Cl.
*H01L 23/495*  (2006.01)
*H03F 3/16*  (2006.01)

(52) U.S. Cl.
CPC .... *H01L 23/4952* (2013.01); *H01L 23/49562* (2013.01); *H03F 3/16* (2013.01)

(58) Field of Classification Search
CPC ..... H03F 3/00; H03F 3/04; H03F 3/10; H03F 3/16; H01L 23/52; H01L 24/42–24/49; H01L 2224/43–2224/43986
See application file for complete search history.

(56) References Cited

U.S. PATENT DOCUMENTS

| 5,357,212 A | 10/1994 | Kohno | |
|---|---|---|---|
| 2005/0083723 A1* | 4/2005 | Blednov | ................. H01L 24/49 |
| | | | 365/154 |
| 2006/0172465 A1* | 8/2006 | Brennan | ............. B23K 20/005 |
| | | | 438/122 |

(Continued)

FOREIGN PATENT DOCUMENTS

| JP | Hei06-053715 A | 2/1994 |
|---|---|---|
| JP | Hei07-307626 A | 11/1995 |

(Continued)

*Primary Examiner* — Scott B Geyer
(74) *Attorney, Agent, or Firm* — Studebaker & Brackett PC

(57) ABSTRACT

An amplifier includes a package, a transistor chip having a gate pad and a drain pad formed elongately, the transistor chip being provided in the package, and a plurality of drain bonding wires connected to the drain pad, wherein the plurality of drain bonding wires include a first outer-most bonding wire connected to one of two end portions of the drain pad, a second outer-most bonding wire connected to the other of the two end portions of the drain pad, and an intermediate bonding wire interposed between the first outer-most bonding wire and the second outer-most bonding wire, each of the plurality of drain bonding wires is longer than 1 mm, and the first outer-most bonding wire and the second outer-most bonding wire have loop heights larger than a loop height that the intermediate bonding wire has.

24 Claims, 15 Drawing Sheets

(56) References Cited

U.S. PATENT DOCUMENTS

| | | | |
|---|---|---|---|
| 2008/0088012 A1* | 4/2008 | Ohkawa | H01L 21/4842 |
| | | | 257/735 |
| 2008/0246547 A1* | 10/2008 | Blednov | H01L 23/66 |
| | | | 331/109 |
| 2008/0278241 A1* | 11/2008 | Harm | H01L 23/66 |
| | | | 330/286 |
| 2010/0140721 A1 | 6/2010 | Takagi | |
| 2014/0145791 A1* | 5/2014 | Svechtarov | H03F 1/0288 |
| | | | 330/295 |
| 2015/0294930 A1* | 10/2015 | Zhu | H01L 23/64 |
| | | | 257/337 |

FOREIGN PATENT DOCUMENTS

| | | |
|---|---|---|
| JP | Hei11-238851 A | 8/1999 |
| JP | 2001-148616 A | 5/2001 |
| JP | 2003-110382 A | 4/2003 |
| JP | 2010-161348 A | 7/2010 |
| JP | 2015-015496 A | 1/2015 |

* cited by examiner

AMPLIFIER PACKAGE WITH MULTIPLE DRAIN BONDING WIRES

BACKGROUND OF THE INVENTION

Field of the Invention

The present invention relates to an amplifier which amplifies a signal.

Background Art

JP2001-148616A discloses an amplifier having a FET chip and a matching substrate provided in a package and capable of realizing electrical connections by means of bonding wires.

In recent years, there has been a tendency to increase the outputs of amplifiers. With increasing the output from a transistor, there is a problem that a large current flows through a bonding wire connected to a drain pad of the transistor to cause melting of the bonding wire.

SUMMARY OF THE INVENTION

In view of the above-described problem, an object of the present invention is to provide an amplifier capable of inhibiting melting of bonding wires.

The features and advantages of the present invention may be summarized as follows.

According to one aspect of the present invention, an amplifier includes a package, a transistor chip having a gate pad and a drain pad formed elongately, the transistor chip being provided in the package, and a plurality of drain bonding wires connected to the drain pad, wherein the plurality of drain bonding wires include a first outer-most bonding wire connected to one of two end portions of the drain pad, a second outer-most bonding wire connected to the other of the two end portions of the drain pad, and an intermediate bonding wire interposed between the first outer-most bonding wire and the second outer-most bonding wire, each of the plurality of drain bonding wires is longer than 1 mm, and the first outer-most bonding wire and the second outer-most bonding wire have loop heights larger than a loop height that the intermediate bonding wire has.

According to another aspect of the present invention, an amplifier includes a package, a transistor chip having a gate pad and a drain pad formed elongately, the transistor chip being provided in the package, and a plurality of drain bonding wires connected to the drain pad, wherein the plurality of drain bonding wires include a first outer-most bonding wire connected to one of two end portions of the drain pad, a second outer-most bonding wire connected to the other of the two end portions of the drain pad, and an intermediate bonding wire interposed between the first outer-most bonding wire and the second outer-most bonding wire, and each of the first outer-most bonding wire and the second outer-most bonding wire is thicker than the intermediate bonding wire.

According to another aspect of the present invention, an amplifier includes a package, a transistor chip having a gate pad and a drain pad formed elongately, the transistor chip being provided in the package, and a plurality of drain bonding wires connected to the drain pad, wherein the plurality of drain bonding wires include a plurality of first outer-most bonding wires connected to one of two end portions of the drain pad so that their landing points are tangent to each other, a plurality of second outer-most bonding wires connected to the other of the two end portions of the drain pad so that their landing points are tangent to each other, and an intermediate bonding wire interposed between the plurality of first outer-most bonding wires and the plurality of second outer-most bonding wires, the plurality of first outer-most bonding wires differ in loop height from each other; and the plurality of second outer-most bonding wires differ in loop height from each other.

According to another aspect of the present invention, an amplifier includes a package, a transistor chip having a gate pad and a drain pad formed elongately, the transistor chip being provided in the package, and a plurality of drain bonding wires connected to the drain pad, wherein the plurality of drain bonding wires are provided so that the drain bonding wire density is higher at two end portions of the drain pad than at an intermediate portion located between the two end portions of the drain pad.

According to another aspect of the present invention, an amplifier includes a package, a transistor chip having a gate pad and a drain pad formed elongately, the transistor chip being provided in the package, and a plurality of drain bonding wires connected to the drain pad, wherein the plurality of drain bonding wires include two first outer-most bonding wires connected to one of two end portions of the drain pad, two second outer-most bonding wires connected to the other of the two end portions of the drain pad, and an intermediate bonding wire interposed between the two first outer-most bonding wires and the two second outer-most bonding wires, the two first outer-most bonding wires intersect each other as viewed in plan, and the two second outer-most bonding wires intersect each other as viewed in plan.

According to another aspect of the present invention, an amplifier includes a package, a transistor chip having a gate pad and a drain pad formed elongately, the transistor chip being provided in the package, and a plurality of drain bonding wires connected to the drain pad, wherein the plurality of drain bonding wires include a first outer-most bonding wire connected to one of two end portions of the drain pad, a second outer-most bonding wire connected to the other of the two end portions of the drain pad, and an intermediate bonding wire interposed between the first outer-most bonding wire and the second outer-most bonding wire, and each of the first outer-most bonding wire and the second outer-most bonding wire is shorter than the intermediate bonding wire.

According to another aspect of the present invention, an amplifier includes a package, a transistor chip having a gate pad and a drain pad formed elongately, the transistor chip being provided in the package, a plurality of drain bonding wires connected to the drain pad, a substrate provided in the package, and a metal pattern formed on the substrate, wherein the plurality of drain bonding wires include a first outer-most bonding wire connected to one of two end portions of the drain pad, a second outer-most bonding wire connected to the other of the two end portions of the drain pad, and an intermediate bonding wire interposed between the first outer-most bonding wire and the second outer-most bonding wire, the length of a path for a current flowing through the first outer-most bonding wire and the length of a path for a current flowing through the second outer-most bonding wire are made longer than the length of a path for a current flowing through the intermediate bonding wire by forming slits in the metal pattern, and a central portion of the metal pattern to which the intermediate bonding wire is connected is in such a position as to be closer to the transistor chip than two end portions of the metal pattern to which the first outer-most bonding wire and the second outer-most bonding wire are connected.

According to another aspect of the present invention, an amplifier includes a package, a transistor chip having a gate pad and a drain pad formed elongately, the transistor chip being provided in the package, and a plurality of drain bonding wires connected to the drain pad, wherein ones of the plurality of drain bonding wires connected closer to the ends of the drain pad are made higher in loop height.

According to another aspect of the present invention, an amplifier includes a package, a transistor chip having a gate pad and a drain pad formed elongately, the transistor chip being provided in the package, a plurality of drain bonding wires connected to the drain pad, and a package bonding wire having opposite ends connected to the package, wherein the plurality of drain bonding wires include a first outer-most bonding wire connected to one of two end portions of the drain pad, a second outer-most bonding wire connected to the other of the two end portions of the drain pad, and an intermediate bonding wire interposed between the first outer-most bonding wire and the second outer-most bonding wire, and the package bonding wire is positioned between the intermediate bonding wire and the package.

Other and further objects, features and advantages of the invention will appear more fully from the following description.

DETAILED DESCRIPTION OF THE PREFERRED EMBODIMENTS

Figure 1:
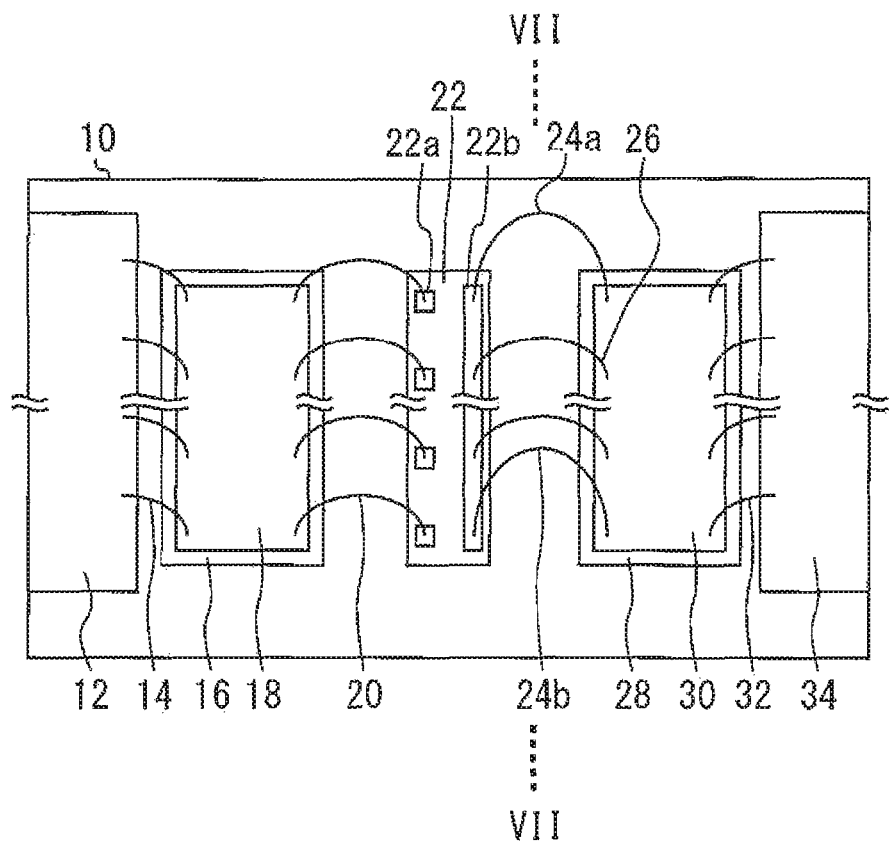
FIG. 1 is a plan view of an amplifier according to the first embodiment.

An amplifier according to an embodiment of the present invention will be described with reference to the drawings. Components identical or corresponding to each other are assigned the same reference characters and repeated description of them is avoided in some cases.

First Embodiment

FIG. 1 is a plan view of an amplifier according to the first embodiment. The amplifier has a package 10. The package 10 is formed of a metal. While the package 10 covers contents, internal components of the package 10 are illustrated in FIG. 1 and other figures for ease of explanation. An input terminal 12 and an output terminal 34 are fixed in the package 10. An input matching substrate 16 is provided in the package 10. A metal pattern 18 is formed on the input matching substrate 16.

A transistor chip 22 is provided in the package 10. The transistor chip 22 is, for example, a FET chip. The transistor chip 22 has gate pads 22a and a drain pad 22b formed elongately. The transistor chip 22 includes a plurality of transistor cells. An output matching substrate 28 is provided in the package 10. A metal pattern 30 is formed on the output matching substrate 28. The input matching substrate 16, the transistor chip 22 and the output matching substrate 28 are die-bonded to the package 10.

A plurality of bonding wires are provided in the package 10 for the purpose of electrically connecting component parts in the package 10. Bonding wires 14 connect the input terminal 12 and the metal pattern 18 to each other. Bonding wires 20 connect the metal pattern 18 and the gate pads 22a to each other.

A first outer-most bonding wire 24a is connected to one of two end portions of the drain pad 22b. A second outer-most bonding wire 24b is connected to the other of the two end portions of the drain pad 22b. An intermediate bonding wire 26 is connected to a central portion of the drain pad 22b. The intermediate bonding wire 26 is provided in such a position as to be interposed between the first outer-most bonding wire 24a and the second outer-most bonding wire 24b. The number of intermediate bonding wires 26 is not particularly limited. The first outer-most bonding wire 24a, the second outer-most bonding wire 24b and the intermediate bonding wires 26 constitute the "plurality of drain bonding wires" connected to the drain pad 22b. Each of the bonding wires constituting the plurality of drain bonding wires is longer than 1 mm. The first outer-most bonding wire 24a, the second outer-most bonding wire 24b and the intermediate bonding wires 26 are bonding wires which connect the drain pad 22b and the metal pattern 30 to each other.

Connection points between the drain pad 22b and the first outer-most bonding wire 24a, the second outer-most bonding wire 24b and the intermediate bonding wires 26 are arranged along the lengthwise direction of the drain pad 22b.

The first outer-most bonding wire 24a and the second outer-most bonding wire 24b have loop heights larger than a loop height that the intermediate bonding wires 26 have. A "loop height" is a height from a bonding wire connection point of a curved bonding wire to the highest position on the curved bonding wire. The intermediate bonding wires 26 are uniform in loop height.

Bonding wires 32 connect the metal pattern 30 and the output terminal 34 to each other. It is preferable to form each bonding wire by wire bonding. The amplifier having this construction is a discrete amplifier formed as an individual component part.

Figure 2:
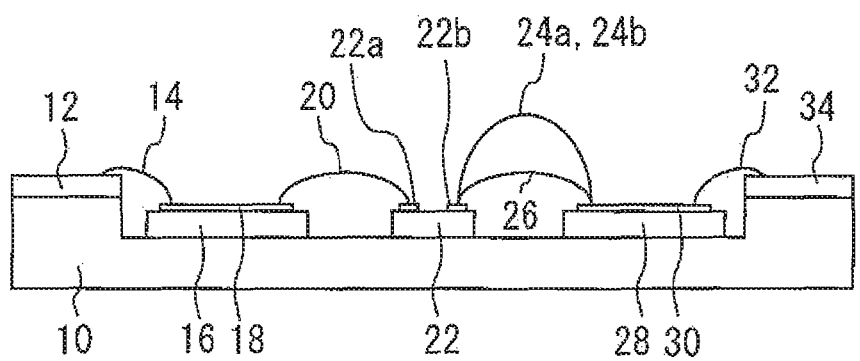
FIG. 2 is a side view of the amplifier.

FIG. 2 is a side view of the amplifier. In FIG. 2, illustration of part of the package 10 is omitted to enable expression of internal portions of the package 10. Each of the loop heights of the first outer-most bonding wire 24a and the second outer-most bonding wire 24b is larger than that of the intermediate bonding wires 26. The difference between the loop height of the first outer-most bonding wire 24a and the loop height of the intermediate bonding wires 26 is 0.8 mm or less. The difference between the loop height of the second outer-most bonding wire 24b and the loop height of the intermediate bonding wires 26 is 0.8 mm or less.

Figure 3:
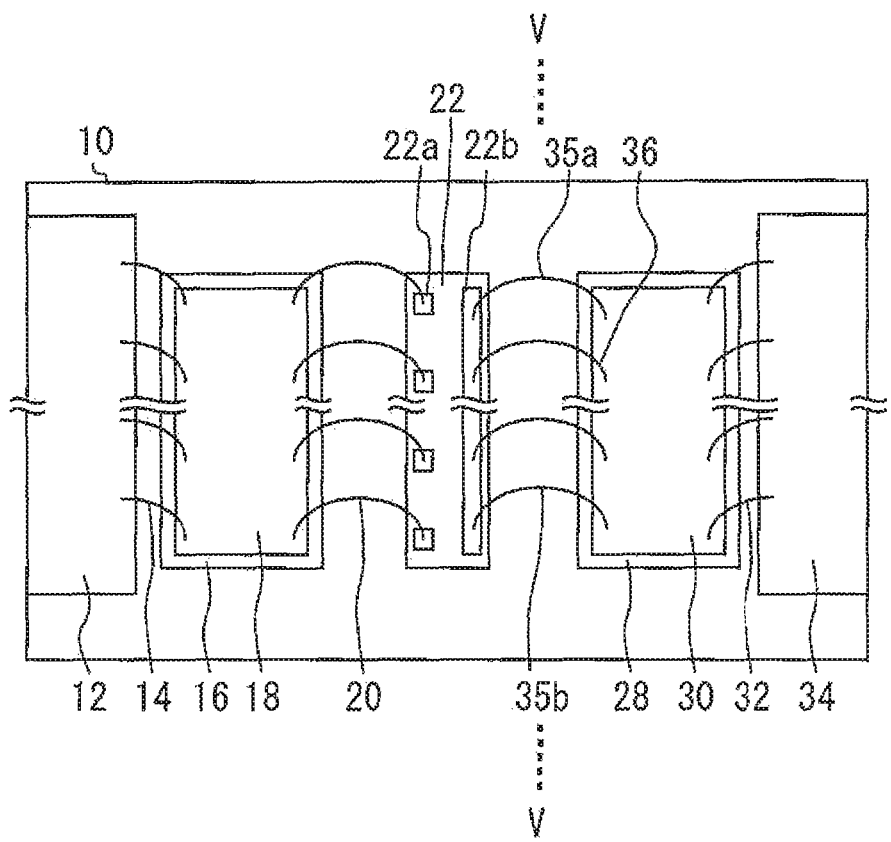
FIG. 3 is a plan view of an amplifier according to the comparative example.
Figure 4:
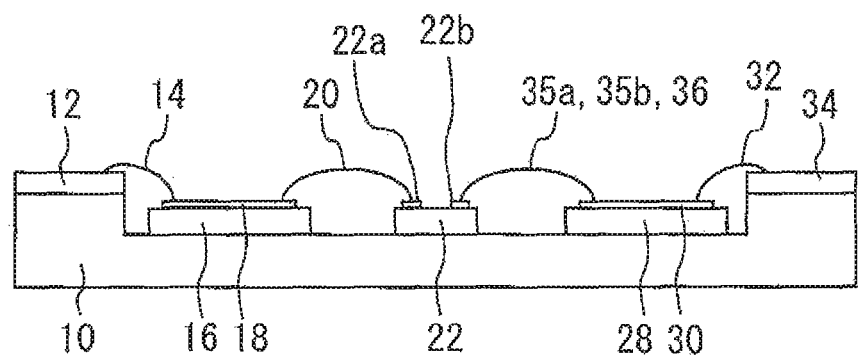
FIG. 4 is a side view of the amplifier according to the comparative example.

A comparative example will be described to facilitate understanding of the significance of the amplifier according to the first embodiment of the present invention. FIG. 3 is a plan view of an amplifier according to the comparative example. A plurality of drain bonding wires include outer-most bonding wires 35a and 35b and intermediate bonding wires 36. The plurality of drain bonding wires are uniform in length. FIG. 4 is a side view of the amplifier according to the comparative example. The plurality of drain bonding wires are uniform in loop height.

The amplifier according to the comparative example has a GaN transistor chip 22 having a total gate width of, for example, about 50 mm and gold bonding wires provided as the plurality of drain bonding wires and having a diameter of 25 μm and a length of about 2 mm. The intervals between the plurality of drain bonding wires are, for example, 0.1 mm. It is experimentally known that when such an amplifier according to the comparative example is operated under a high-output operating condition, the drain bonding wires at the opposite ends are molten.

Figure 5:
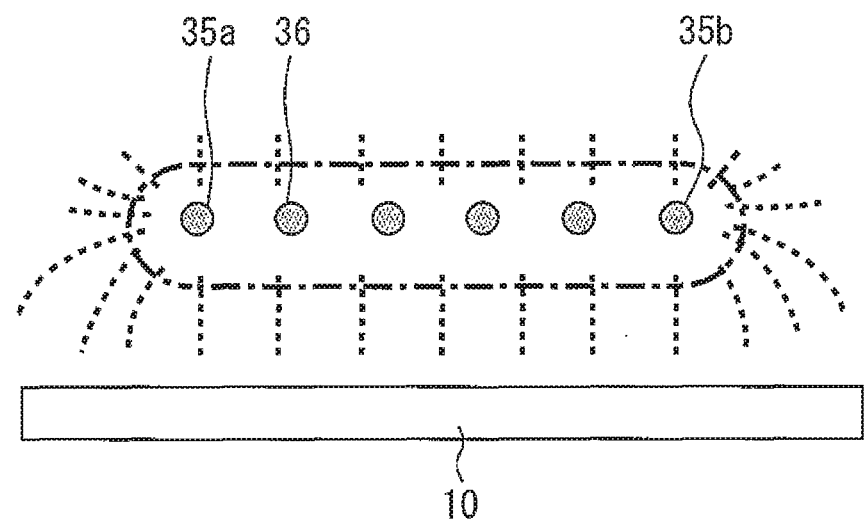
FIG. 5 is a sectional view of the amplifier of FIG. 3.

The cause of larger currents through the drain bonding wires at the opposite ends will be described. FIG. 5 is a sectional view of the amplifier taken along line V-V in FIG. 3. A plane formed by the plurality of drain bonding wires and the package 10 can be considered to be a plane-parallel plate. Since each of bonding wires in a magnetic-field-canceling relationship with the outer-most bonding wires 35a and 35b exists only on one side of the outer-most bonding wire 35a or 35b, a magnetic field generated on the left-hand side of the outer-most bonding wire 35a and a magnetic field generated on the right-hand side of the outer-most bonding wire 35b are not canceled out. Therefore, electric fields are concentrated on the outer-most bonding wires 35a and 35b and currents larger than those flowing through the intermediate bonding wires 36 flow through the outer-most bonding wires 35a and 35b. In FIG. 5, the magnetic fields and the electric fields are shown in a simplified fashion for ease of description. In actuality, the resultant magnetic field around the entire bonding wires is not linear, and the magnetic fields and the electric fields are distributed so as to extend around the bonding wires.

Figure 6:
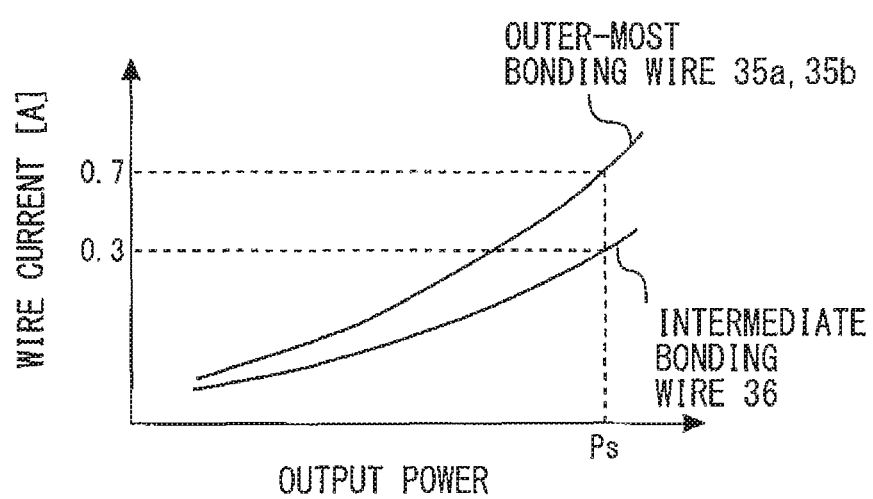
FIG. 6 is a graph showing the results of computation.

FIG. 6 is a graph showing the results of computation of an output power dependence of the currents flowing through the drain bonding wires. With increase in output power of the amplifier, the currents flowing through the drain bonding wires increase. Also, as described above with reference to FIG. 5, the currents flowing through the outer-most bonding wires 35a and 35b become larger than the currents flowing through the intermediate bonding wires 36 because of electric field concentration on the outer-most bonding wires 35a and 35b. In this example of computation, each of the currents flowing through the outer-most bonding wires 35a and 35b at certain output power Ps is 0.7 A, while each of the currents flowing through the intermediate bonding wires 36 is 0.3 A. Through each of the outer-most bonding wires 35a and 35b, the current 2.3 times higher than each of the currents flowing through the intermediate bonding wires 36 flows.

Figure 7:
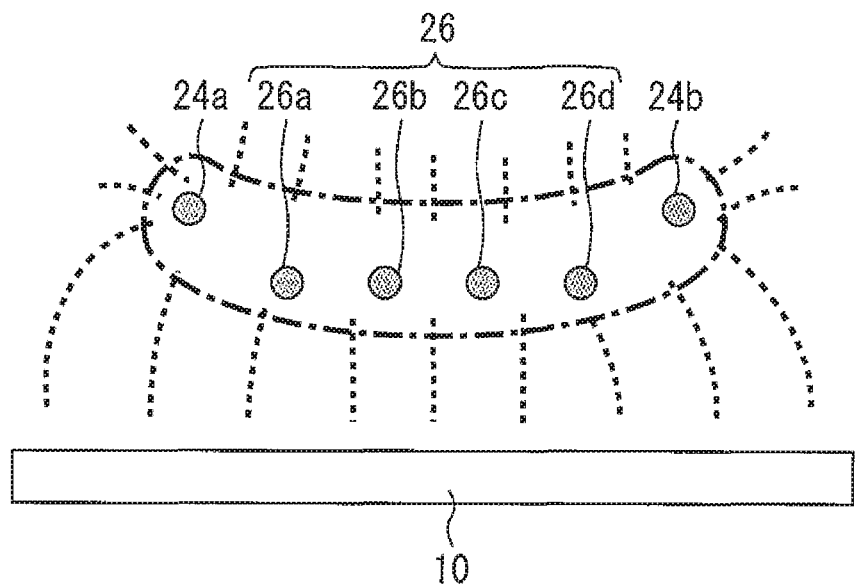
FIG. 7 is a sectional view of FIG. 1.

The amplifier according to the first embodiment of the present invention is capable of relieving the current concentration on the drain bonding wires positioned at the opposite ends in the plurality of drain bonding wires. FIG. 7 is a sectional view taken along line VII-VII in FIG. 1. This line VII-VII is a line extending parallel to the longer side of the transistor chip 22. While the intermediate bonding wires 26 are uniform in height, the first outer-most bonding wire 24a and the second outer-most bonding wire 24b are positioned higher than the intermediate bonding wires 26. The intermediate bonding wires 26 include intermediate bonding wires 26a, 26b, 26c, and 26d. Each of the intermediate bonding wire 26a adjacent to the first outer-most bonding wire 24a and the intermediate bonding wire 26d adjacent to the second outer-most bonding wire 24b is referred to as an adjacent bonding wire as occasion demands.

When currents flow through the plurality of drain bonding wires, magnetic fields are generated around the bonding wires. Between each adjacent pair of the bonding wires, the directions of the magnetic fields are opposite to each other and the magnetic fields cancel each other out. Around the plurality of drain bonding wires as a whole, therefore, the magnetic fields are formed, as indicated by a dot-dash line. Electric fields (lines of electric force) are formed between the bonding wires and the package 10 perpendicularly to the magnetic field, as indicated by broken lines in the figure.

The lines of electric force between the first outer-most bonding wire 24a and the package 10 and the lines of electric force between the second outer-most bonding wire 24b and the package 10 are elongated in the height direction (upward) relative to those in the comparative example. Accordingly, the densities of lines of electric force at the opposite ends of the plurality of drain bonding wires are reduced in comparison with the comparative example. Therefore, the electric fields around the first outer-most bonding wire 24a and the second outer-most bonding wire 24b are relieved, thus enabling reducing the currents flowing through these bonding wires.

Figure 8:
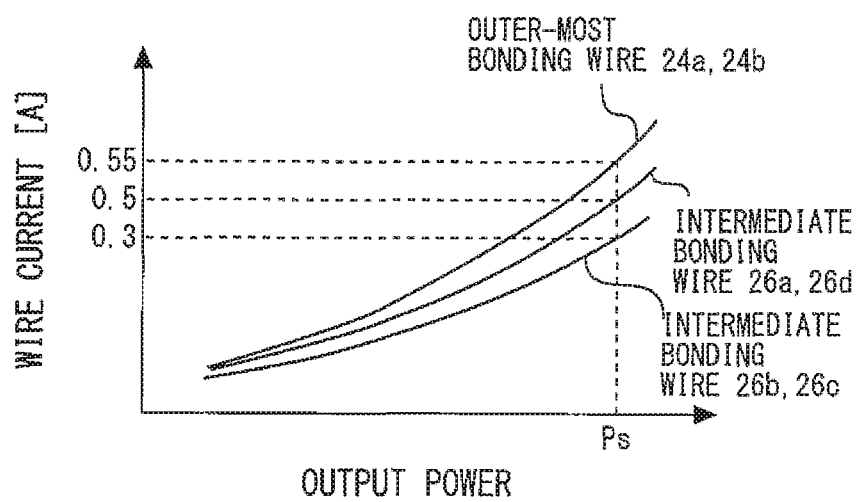
FIG. 8 is a diagram showing the results of computation.

FIG. 8 is a diagram showing the results of computation of the relationship between the bonding wire currents through the plurality of drain bonding wires and the output current. Computation was performed by assuming that each of the loop heights of the first outer-most bonding wire 24a and the second outer-most bonding wire 24b is larger by 0.2 mm than the loop height of the intermediate bonding wires 26. Each of the currents flowing through the first outer-most bonding wire 24a and the second outer-most bonding wire 24b at certain output power Ps is 0.55 A. On the other hand, a current of 0.7 A flows through each of the drain bonding wires at the opposite ends in the amplifier according to the comparative example (see FIG. 6). Thus, the loop heights of the first outer-most bonding wire 24a and the second outer-most bonding wire 24b are set larger than the loop height of the intermediate bonding wires 26, and the currents flowing through the bonding wires at the opposite ends can thereby be reduced by about 20% from those in the case where all the drain bonding wires are uniform in height.

Since the loop heights of the first outer-most bonding wire 24a and the second outer-most bonding wire 24b are increased, the currents through the intermediate bonding wires 26 are not uniform. At power Ps, a current of 0.5 A flows through each of the adjacent bonding wires (intermediate bonding wires 26a and 26d), while a current of 0.3 A flows through each of the intermediate bonding wires 26b and 26c. Thus, in the case where the loop heights of the bonding wires at the opposites ends in the plurality of drain bonding wires are increased, the currents flowing through the inner bonding wires next to the bonding wires at the opposite ends are increased.

Figure 9:
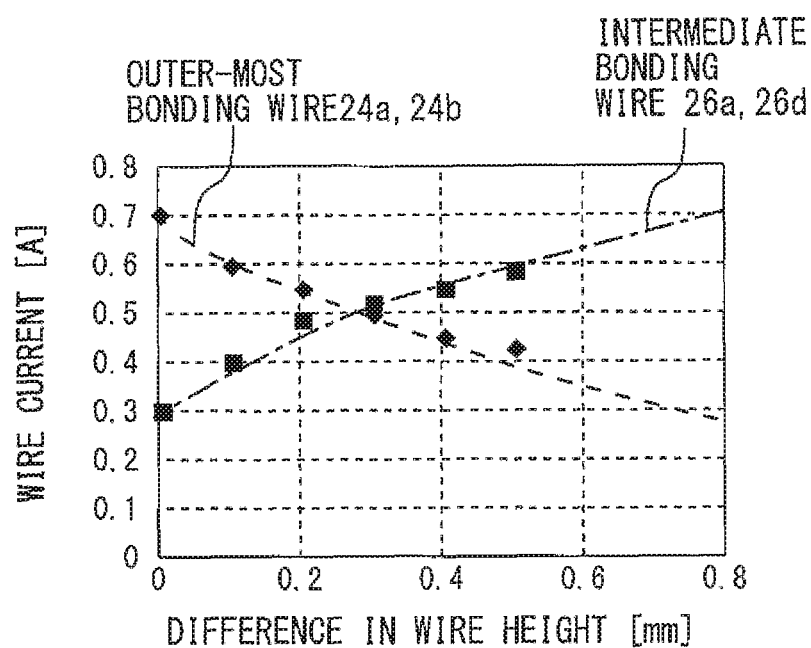
FIG. 9 is a diagram showing the influence of loop heights on the bonding wire currents.

FIG. 9 is a diagram showing the influence on the bonding wire currents of the difference between the loop heights of the first and second outer-most bonding wires and the loop height of the intermediate bonding wires. FIG. 9 shows the currents through the first outer-most bonding wire 24a and the second outer-most bonding wire 24b and the bonding wire currents through the adjacent bonding wires (intermediate bonding wires 26a and 26b). The abscissa represents the difference between the loop heights of the first outer-most bonding wire 24a and the second outer-most bonding wire 24b and the loop height of the intermediate bonding wires 26. The plurality of intermediate bonding wires 26 are uniform in loop height. It is meant that the loop height of the intermediate bonding wires 26 and the loop height of the adjacent bonding wires are equal to each other.

When the loop heights of the first outer-most bonding wire 24a and the second outer-most bonding wire 24b are the same as the loop height of the intermediate bonding wires 26, the difference in bonding wire height is zero. At this time, a current of 0.7 A flows through each of the first outer-most bonding wire 24a and the second outer-most bonding wire 24b. As the loop heights of the first outer-most bonding wire 24a and the second outer-most bonding wire 24b are increased relative to the loop height of the intermediate bonding wires 26, the bonding wire currents through the first outer-most bonding wire 24a and the second outer-most bonding wire 24b become smaller, while the bonding wire currents through the adjacent bonding wires (intermediate bonding wires 26a and 26d) tend to increase.

When the difference in bonding wire height is about 0.8 mm, the bonding wire currents in the adjacent bonding wires are substantially the same as the bonding wire currents (0.7 A) flowing through the first outer-most bonding wire 24a and the second outer-most bonding wire 24b when the difference in bonding wire height is 0 mm. If the difference in bonding wire height becomes larger than this value, excessive currents flow through the adjacent bonding wires. It is, therefore, preferable that the difference in bonding wire height be 0.8 mm or less.

Figure 10:
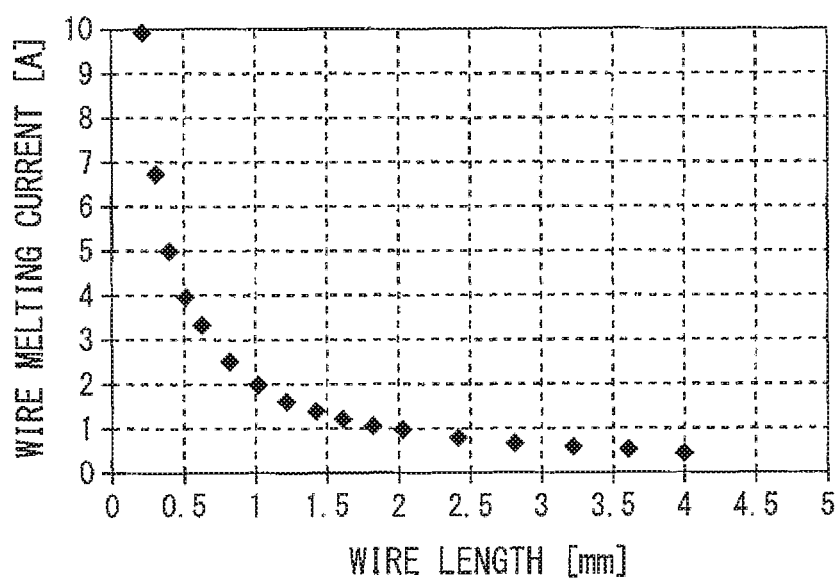
FIG. 10 is a diagram showing the relationship between the bonding wire length and the bonding wire melting current.

FIG. 10 is a diagram showing the relationship between the bonding wire length and the bonding wire melting current. FIG. 10 shows a bonding wire length dependence of the bonding wire melting current in a case where the frequency is 3.0 GHz and the bonding wires have a diameter of 25 μm. If a current excessing the bonding wire melting current flows, the bonding wire melts. It can be understood from FIG. 10 that if the bonding wire length is increased, the bonding wire melting current is reduced. For example, in an internal-matching-type amplifier, the bonding wire length is generally about 0.3 mm and the bonding wire melting current is about 6 A as a result of layout of transistors and matching substrates in a package. With such an amplifier, therefore, there is no considerable apprehension about bonding wire melting.

On the other hand, in a discrete amplifier, the bonding wire length is generally longer than 1 mm and the bonding wire melting current is equal to or smaller than 2 A. When the bonding wire length is shorter than 1 mm, the bonding wire melting current changes largely depending on the bonding wire length. However, when the bonding wire length is longer than 1 mm, the bonding wire melting current does not change largely even when the bonding wire length is changed.

In the first embodiment of the present invention, each of the plurality of drain bonding wires is made longer than 1 mm. Accordingly, even though the first outer-most bonding wire 24a and the second outer-most bonding wire 24b are made longer than the intermediate bonding wires 26, the bonding wire melting current is reduced only slightly and a considerable reduction in bonding wire melting current can be prevented.

A technique to make the first outer-most bonding wire and the second outer-most bonding wire longer for the purpose of securing uniformity in impedance as seen in the direction from each transistor cell to the circuit side is known. However, if the bonding wires are simply made longer, the bonding wire melting current is reduced, as shown in FIG. 10, and it is not possible to prevent bonding wire melting. In particular, in the case of bonding wires of a length equal to or smaller than 1 mm used in an internal-matching-type amplifier or the like, the reduction in bonding wire melting current becomes more considerable if the bonding wire length is increased. That is, in an amplifier in which the drain bonding wire length is longer than 1 mm, bonding wire melting can be prevented by making the first outer-most bonding wire 24a and the second outer-most bonding wire 24b higher than the intermediate bonding wires 26.

Thus, in the amplifier according to the first embodiment of the present invention, a plurality of drain bonding wires longer than 1 mm are provided and the loop heights of the first outer-most bonding wire 24a and the second outer-most bonding wire 24b in the plurality of drain bonding wires are set larger than the loop height of the intermediate bonding wires 26. While current concentration on the first outer-most bonding wire 24a and the second outer-most bonding wire 24b is thereby relieved, the reduction in bonding wire melting current can be limited.

The amplifier according to the first embodiment of the present invention can be variously modified within such a scope as not to lose its features. For example, the transistor chip 22 and the package 10 may be directly connected by bonding wires without using the input matching substrate 16 and the output matching substrate 28. In such a case, the plurality of drain bonding wires connect the drain pad and the package (terminals) to each other. The transistor chip 22 may be constituted by GaN, GaAs or LDMOS for example.

These modifications can also be applied as appropriate to amplifiers according to embodiments described below. Each of the amplifiers according to the embodiments described below has a number of commonalities with the first embodiment and will therefore be described mainly with respect to points of difference from the first embodiment.

Second Embodiment

Figure 11:
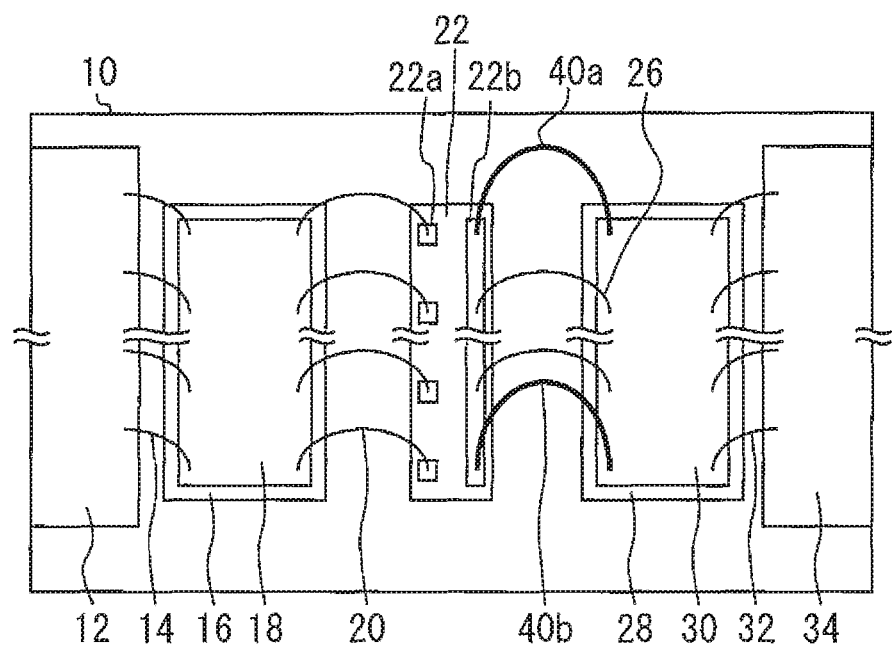
FIG. 11 is a plan view of the amplifier according to the second embodiment.

FIG. 11 is a plan view of the amplifier according to the second embodiment. A first outer-most bonding wire 40a and a second outer-most bonding wire 40b are thicker than intermediate bonding wires 26. The bonding wire diameter of ordinary bonding wires used in amplifiers is 25 μm. The thicknesses of the first outer-most bonding wire 40a and the second outer-most bonding wire 40b are set equal to or larger than 25 μm. The loop heights of the first outer-most bonding wire 40a and the second outer-most bonding wire 40b are larger than the loop height of the intermediate bonding wires 26, as are the corresponding heights in the first embodiment.

Figure 12:
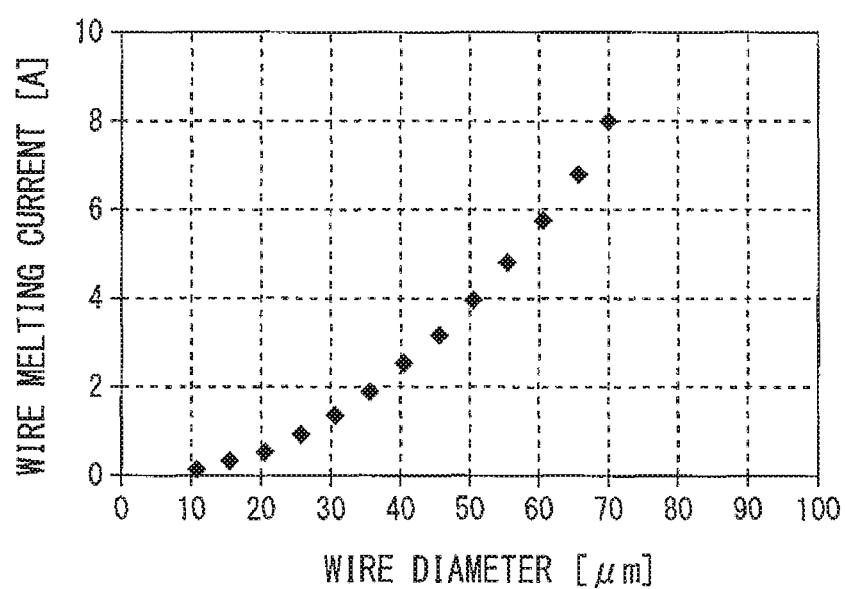
FIG. 12 is a diagram showing the relationship between the bonding wire diameter and the bonding wire melting current.

FIG. 12 is a diagram showing the relationship between the bonding wire diameter of the drain bonding wires and the bonding wire melting current. The graph of FIG. 12 was made by assuming that the frequency is 3.0 GHz and the bonding wire length is 2 mm. It can be understood that if the bonding wire diameter is increased, the bonding wire melting current is increased. Therefore, possible melting of the first outer-most bonding wire and the second outer-most bonding wire can be avoided by thickly forming these bonding wires. Also, current concentration on the first outer-most bonding wire 40a and the second outer-most bonding wire 40b can be limited by setting the loop heights of the first outer-most bonding wire 40a and the second outer-most bonding wire 40b larger than the loop height of the intermediate bonding wires 26. If the first outer-most bonding wire 40a and the second outer-most bonding wire 40b are thicker than the intermediate bonding wires 26, it is not necessarily required that the diameter be set equal to or larger than 25 μm.

Third Embodiment

Figure 13:
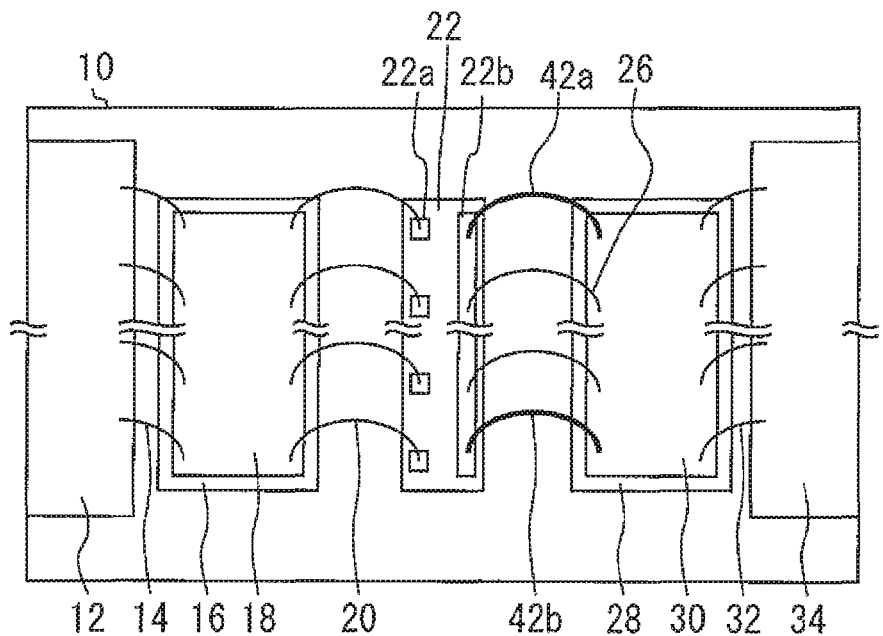
FIG. 13 is a plan view of the amplifier according to the third embodiment.

FIG. 13 is a plan view of the amplifier according to the third embodiment. A first outer-most bonding wire 42a and a second outer-most bonding wire 42b are thicker than intermediate bonding wires 26. The lengths of a plurality of drain bonding wires are equal to each other. The diameter of the first outer-most bonding wire 42a and the second outer-most bonding wire 42b are larger than 25 μm for example. Possible melting of the first outer-most bonding wire 42a and the second outer-most bonding wire 42b can be avoided by thickly forming these bonding wires.

Fourth Embodiment

Figure 14:
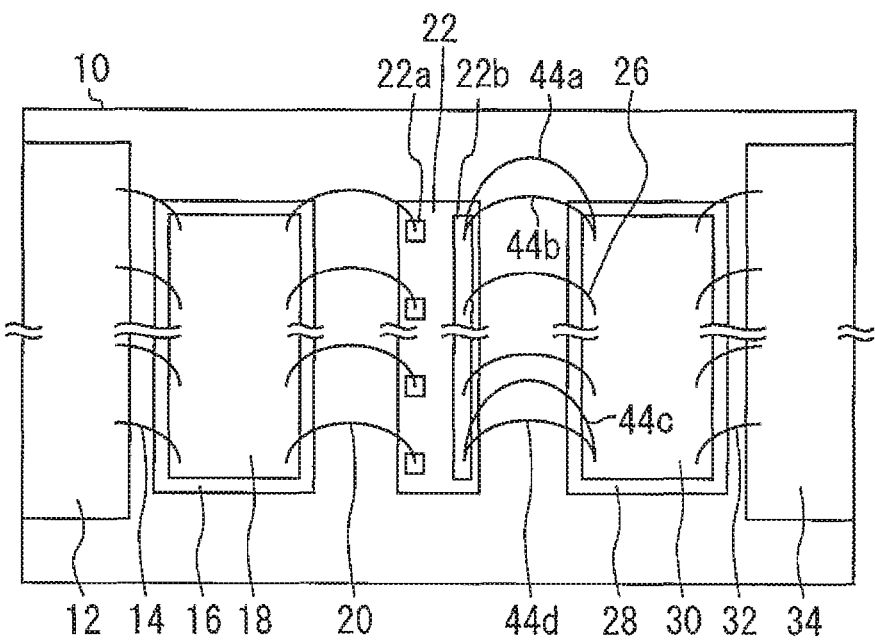
FIG. 14 is a plan view of the amplifier according to the fourth embodiment.

FIG. 14 is a plan view of the amplifier according to the fourth embodiment. A plurality of drain bonding wires include first outer-most bonding wires 44a and 44b, second outer-most bonding wires 44c and 44d and intermediate bonding wires 26. There are the two first outer-most bonding wires and the two second outer-most bonding wires. The two first outer-most bonding wires 44a and 44b are connected to one of two end portions of a drain pad 22b so that their landing points are tangent to each other. The two second outer-most bonding wires 44c and 44d are connected to the other of the two end portions of the drain pad 22b so that their landing points are tangent to each other.

The first outer-most bonding wire 44a and the first outer-most bonding wire 44b differ in loop height from each other. That is, the loop height of the first outer-most bonding wire 44a is larger than that of the first outer-most bonding wire 44b. Also, the second outer-most bonding wire 44c and the second outer-most bonding wire 44d differ in loop height from each other. That is, the loop height of the second outer-most bonding wire 44c is larger than that of the second outer-most bonding wire 44d. The intermediate bonding wires 26 are provided at positions between the plurality of first outer-most bonding wires and the plurality of second outer-most bonding wires.

As described above, a current tends to flow largely through each of the bonding wires connected to the opposite end portions of the drain pad 22b. In the amplifier according to the fourth embodiment of the present invention, the two first outer-most bonding wires 44a and 44b jointly carry such a large current, and the two second outer-most bonding wires 44c and 44d jointly carry such a large current. The current per bonding wire can thereby be reduced, thus inhibiting melting of the bonding wires.

In the fourth embodiment of the present invention, two first outer-most bonding wires and two second outer-most bonding wires are provided. A current dispersing effect, however, can be obtained as long as each of the number of first outer-most bonding wires and the number of second outer-most bonding wires is two or more. Therefore, three first outer-most bonding wires and three second outer-most bonding wires, for example, may be provided.

Fifth Embodiment

Figure 15:
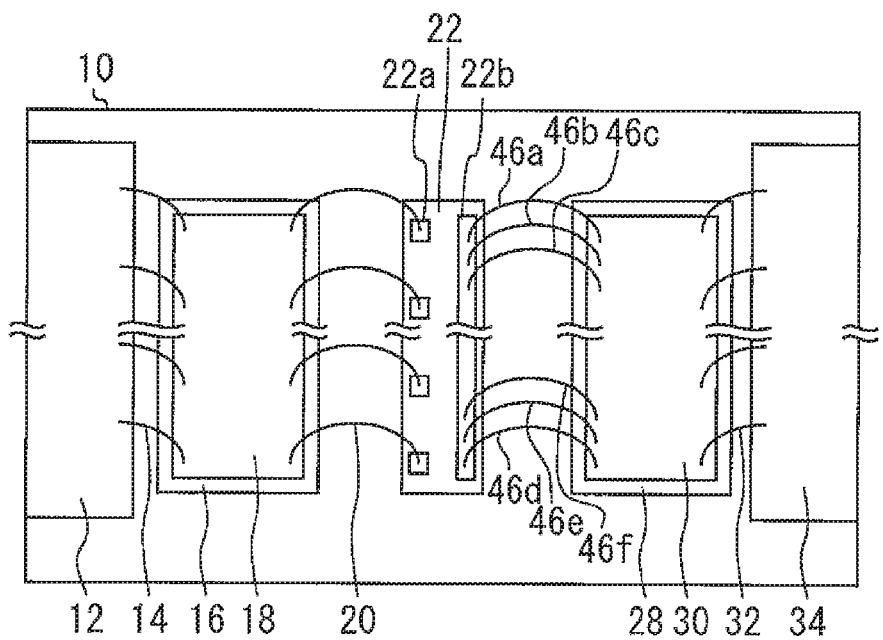
FIG. 15 is a plan view of the amplifier according to the fifth embodiment.

FIG. 15 is a plan view of the amplifier according to the fifth embodiment. A plurality of drain bonding wires are constituted of drain bonding wires 46a, 46b, 46c, 46d, 46e, and 46f. The plurality of drain bonding wires 46a, 46b, 46c, 46d, 46e, and 46f are provided so that the drain bonding wire density is higher at two end portions of the drain pad 22b than at an intermediate portion positioned between the two end portions of the drain pad 22b. While no intermediate bonding wires are shown in FIG. 15, intermediate bonding wires may be provided. The drain bonding wire interval in terms of center-to-center distance between the bonding wires is 0.03 to 1 mm at each of the two end portions of the drain pad 22b.

In the amplifier according to the fifth embodiment of the present invention, the drain bonding wires 46b and 46c are positioned near the drain bonding wire 46a connected to one of the two end portions of the drain pad 22b, and the drain bonding wires 46e and 46f are positioned near the drain bonding wire 46d connected to the other of the two end portions of the drain pad 22b. Therefore, the three drain bonding wires (44a, 44b, 44c) can jointly carry a large current, and the three drain bonding wires (44d, 44e, 440 can jointly carry a large current. The currents flowing through the drain bonding wires (46a, 46d) can thus be limited.

As described above with reference to FIG. 6, in gold bonding wires having a bonding wire diameter of 25 μm and a length of about 2 mm, the bonding wire current computed by setting the bonding wire interval in terms of center-to-center distance between the bonding wires to 0.1 mm is 0.7 A at certain output Ps. However, the bonding wire current computed by setting the bonding wire interval in terms of center-to-center distance between the bonding wires to a smallest possible distance of 0.03 mm for avoiding contact between the bonding wires is 0.5 A at certain output Ps. That is, the bonding wire current can be reduced by about 30%.

Thus, melting of the drain bonding wires positioned at the opposite ends in the plurality of drain bonding wires can be avoided by setting the drain bonding wire density higher at the two end portions of the drain pad 22b than at the intermediate portion positioned between the two end portions of the drain pad 22b.

Sixth Embodiment

Figure 16:
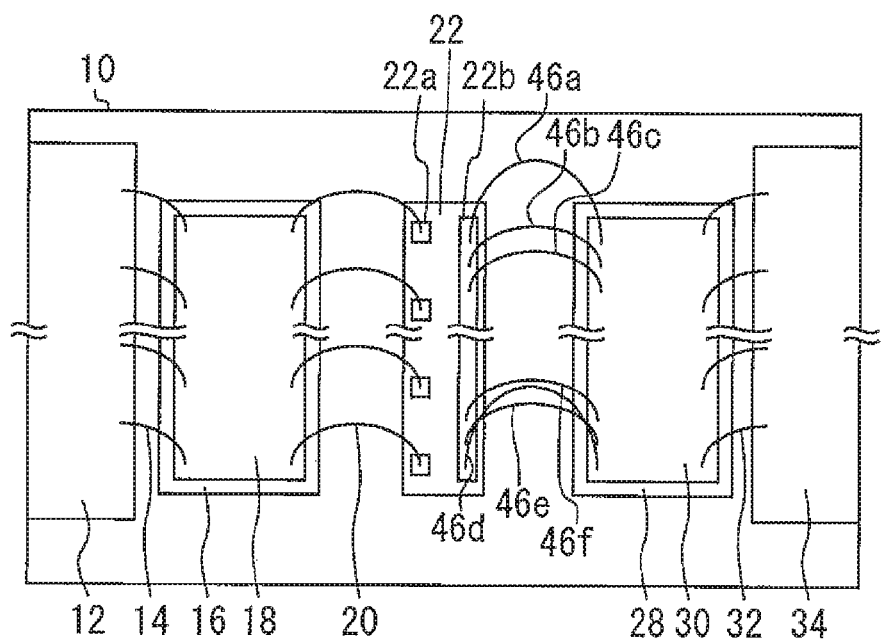
FIG. 16 is a plan view of the amplifier according to the sixth embodiment.

FIG. 16 is a plan view of the amplifier according to the sixth embodiment. This amplifier has a number of points of similarity to the amplifier according to the fifth embodiment and will therefore be described mainly with respect to points of difference from the fifth embodiment. A drain bonding wire 46a is a first outer-most bonding wire and a drain bonding wire 46d is a second outer-most bonding wire. The loop height of the first outer-most bonding wire (46a) connected to one of the two end portions and the loop height of the second outer-most bonding wire 46d connected to the other of the two end portions are larger than the loop heights of the plurality of intermediate bonding wires connected to the intermediate portion. The currents through the first outer-most bonding wire (46a) and the second outer-most bonding wire (46d) are thereby limited, thus enabling prevention of melting of these bonding wires.

Seventh Embodiment

Figure 17:
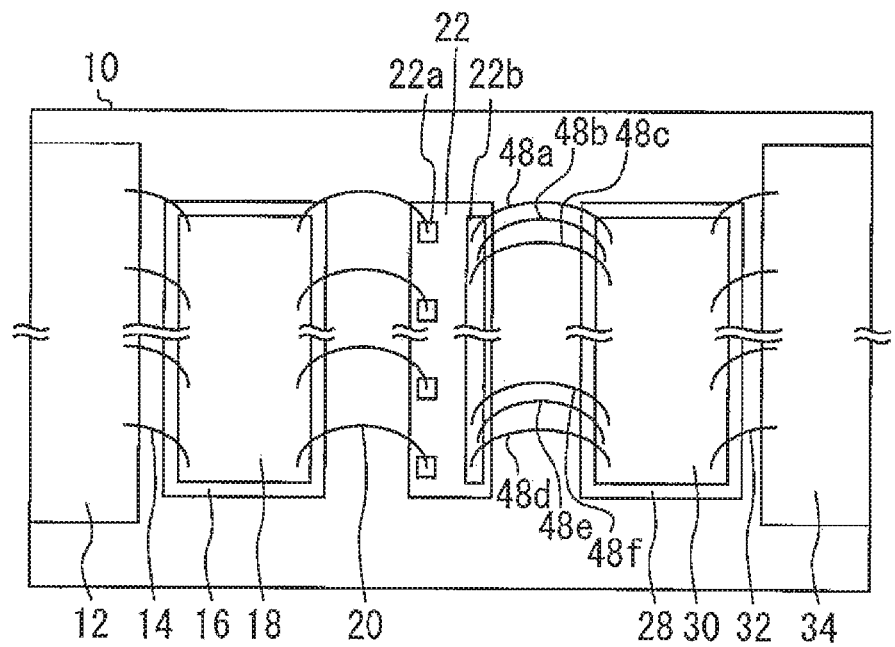
FIG. 17 is a plan view of the amplifier according to the seventh embodiment.

FIG. 17 is a plan view of the amplifier according to the seventh embodiment. This amplifier has a number of points of similarity to the amplifier according to the fifth embodiment and will therefore be described mainly with respect to points of difference from the fifth embodiment. A plurality of first outer-most bonding wires (48a, 48b, 48c) connected to one of the two end portions of the drain pad and a plurality of second outer-most bonding wires 48d, 48e, 48f connected to the other of the two end portions of the drain pad 22b are connected to the drain pad 22b in a staggered fashion (in zigzag form) as viewed in plan.

In the case where the points of connection of the plurality of drain bonding wires to the drain pad 22b are linearly arranged as viewed in plan, it may be difficult to set the bonding wires at small intervals due to a limiting factor in a wire bonding apparatus. In the seventh embodiment of the present invention, however, the points of landing (grounding points) of the plurality of drain bonding wires on the drain pad are staggered to enable reducing the bonding wire intervals. At the two end portions of the drain pad, the currents through the bonding wires can be reduced by reducing the bonding wire intervals.

Eighth Embodiment

Figure 18:
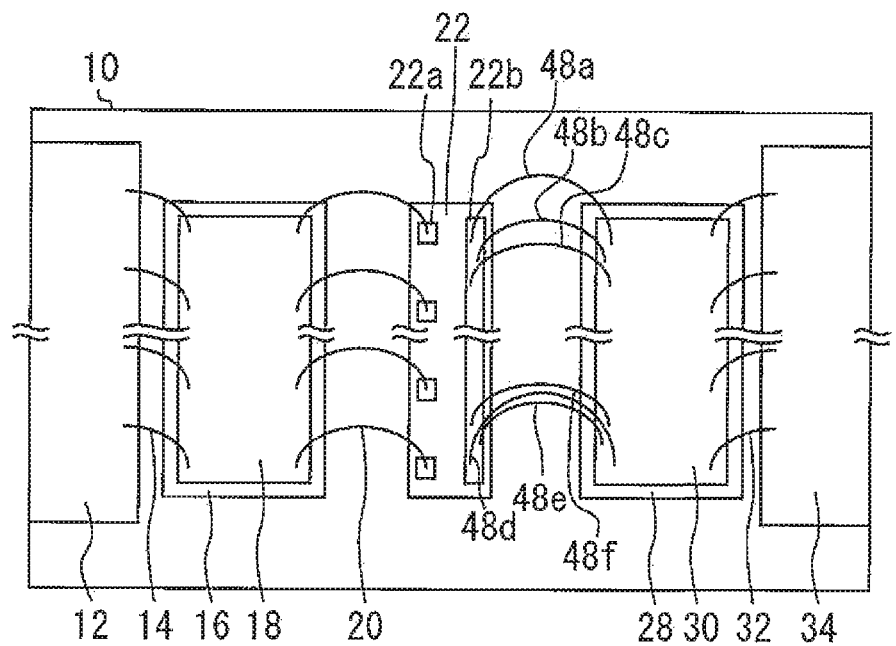
FIG. 18 is a plan view of the amplifier according to the eighth embodiment.

FIG. 18 is a plan view of the amplifier according to the eighth embodiment. This amplifier has a number of points of similarity to the amplifier according to the seventh embodiment and will therefore be described mainly with respect to points of difference from the seventh embodiment. The drain bonding wires 48a and 48d positioned at the opposite ends in the plurality of drain bonding wires are higher in loop height than the other drain bonding wires. Moreover, the drain bonding wires 48a, 48b, 48c, 48d, 48e, and 48f are connected to the drain pad 22b in a staggered fashion as viewed in plan.

Concentration of electric fields on the drain bonding wires positioned at the opposite ends in the plurality of drain bonding wires can therefore be prevented. Also, at the two end portions of the drain pad 22b, the currents through the bonding wires can be reduced by reducing the bonding wire intervals.

Ninth Embodiment

Figure 19:
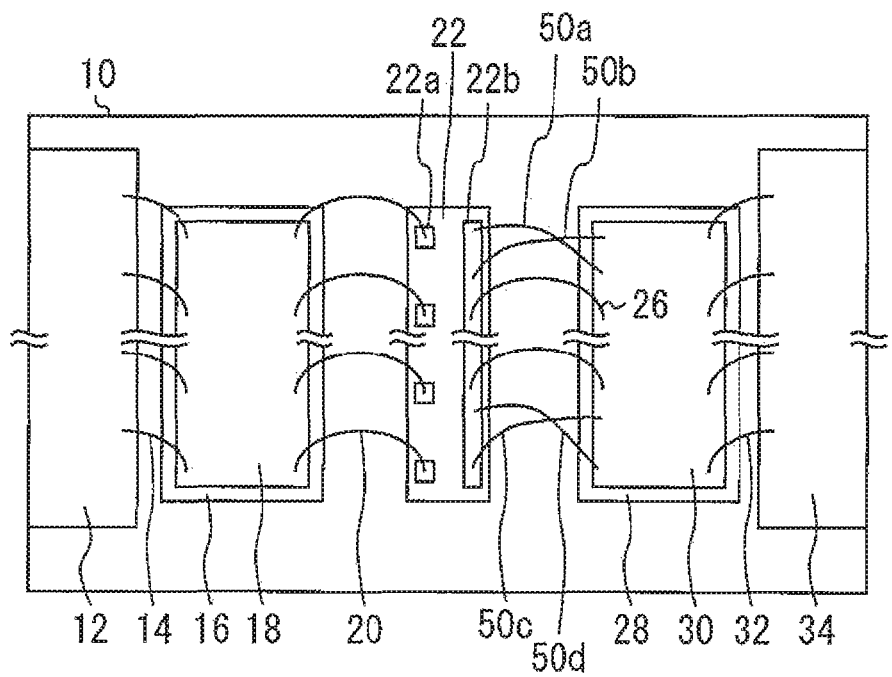
FIG. 19 is a plan view of the amplifier according to the ninth embodiment.

FIG. 19 is a plan view of the amplifier according to the ninth embodiment. A plurality of drain bonding wires connect the drain pad 22b and the metal pattern 30 to each other. The plurality of drain bonding wires include two first outer-most bonding wires 50a and 50b connected to one of two end portions of the drain pad 22b, two second outer-most bonding wires 50c and 50d connected to the other of the two end portions of the drain pad 22b, and intermediate bonding wires 26 interposed between the two first outer-most bonding wires 50a and 50b and the two second outer-most bonding wires 50c and 50d. The two first outer-most bonding wires 50a and 50b intersect each other as viewed in plan, and the two second outer-most bonding wires 50c and 50d intersect each other as viewed in plan.

Thus, the bonding wires connected to the opposite ends of the drain pad 22b and the inner bonding wires next to these bonding wires are made to intersect each other as viewed in plan. For example, the first outer-most bonding wire 50a extends toward an inner portion of the output matching substrate 28 in its extension toward the output matching substrate 28, while the first outer-most bonding wire 50b extends toward an outer portion of the output matching substrate 28 in its extension toward the output matching substrate 28. The first outer-most bonding wires 50a and 50b can carry the current flowing through one of the two end portions of the drain pad 22b. Thus no large current concentrates on one bonding wire.

The second outer-most bonding wire 50c extends toward an inner portion of the output matching substrate 28 in its extension toward the output matching substrate 28, while the second outer-most bonding wire 50d extends toward an outer portion of the output matching substrate 28 in its extension toward the output matching substrate 28. The second outer-most bonding wires 50c and 50d can carry the current flowing through the other end portion of the drain pad 22b. Thus no large current concentrates on one bonding wire.

Tenth Embodiment

Figure 20:
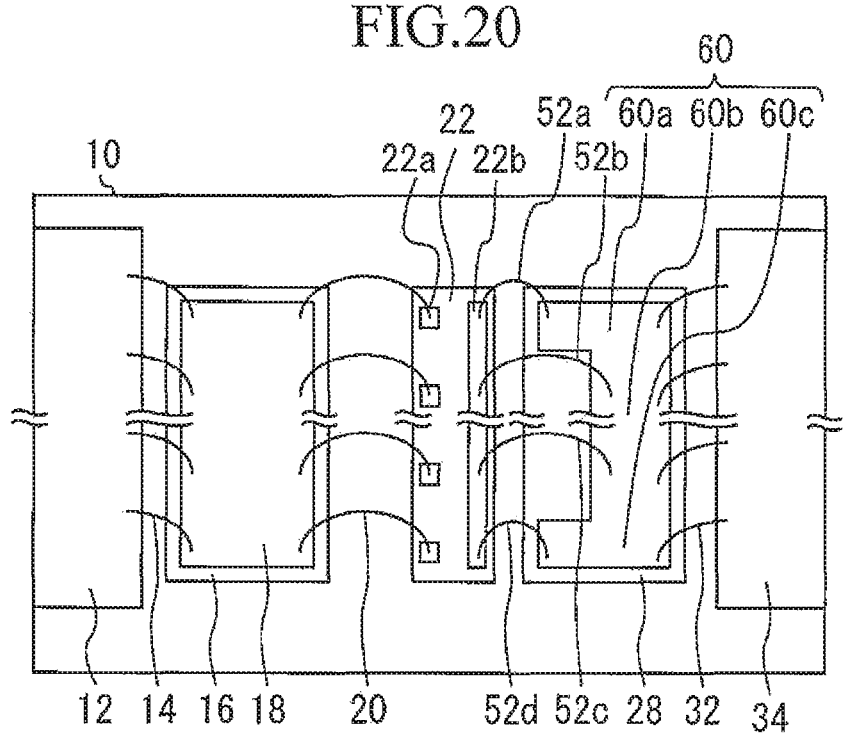
FIG. 20 is a plan view of the amplifier according to the tenth embodiment.

FIG. 20 is a plan view of the amplifier according to the tenth embodiment. A plurality of drain bonding wires include a first outer-most bonding wire 52a connected to one of two end portions of the drain pad 22b, a second outer-most bonding wire 52d connected to the other of the two end portions of the drain pad 22b, and intermediate bonding wires 52b and 52c interposed between the first outer-most bonding wire 52a and the second outer-most bonding wire 52d. The first outer-most bonding wire 52a and the second outer-most bonding wire 52d are shorter than the intermediate bonding wires 52b and 52c. The intermediate bonding wires 52b and 52c connect an intermediate portion of the drain pad 22b, which is a portion interposed between the two end portions of the drain pad 22b, and a metal pattern 60 to each other.

The metal pattern 60 formed on the output matching substrate 28 has a first portion 60a opposed to one of the two end portions of the drain pad 22b, a second portion 60b opposed to the intermediate portion of the drain pad 22b, and a third portion 60c opposed to the other of the two end portions of the drain pad 22b. The distance between one of the two end portions of the drain pad 22b and the first portion 60a and the distance between the other of the two end portions of the drain pad 22b and the third portion 60c are smaller than the distance between the intermediate portion of the drain pad 22b and the second portion 60b. That is, the first portion 60a and the third portion 60c extend farther toward the transistor chip 22 than the second portion 60b does.

The first outer-most bonding wire 52a is connected to the first portion 60a; the intermediate bonding wires 52b and 52c are connected to the second portion 60b; and the second outer-most bonding wire 52d is connected to the third portion 60c.

If the bonding wire length is reduced, the meltability of the bonding wire is reduced since the bonding wire melting current is increased, as shown in FIG. 10. In the tenth embodiment of the present invention, the first outer-most bonding wire 52a and the second outer-most bonding wire 52d in the plurality of drain bonding wires are made shorter than the intermediate bonding wires, thereby reducing the meltability of the first outer-most bonding wire 52a and the second outer-most bonding wire 52d.

In a discrete amplifier, long bonding wires connected to a drain pad are positively used for matching. Therefore, if all the drain bonding wires are made as short as the drain bonding wires at the opposite ends, failure to achieve matching may occur, which results in a reduction in band or a reduction in output or efficiency in the characteristics of the amplifier. Therefore, only the drain bonding wires at the opposite ends are shortened.

Eleventh Embodiment

Figure 21:
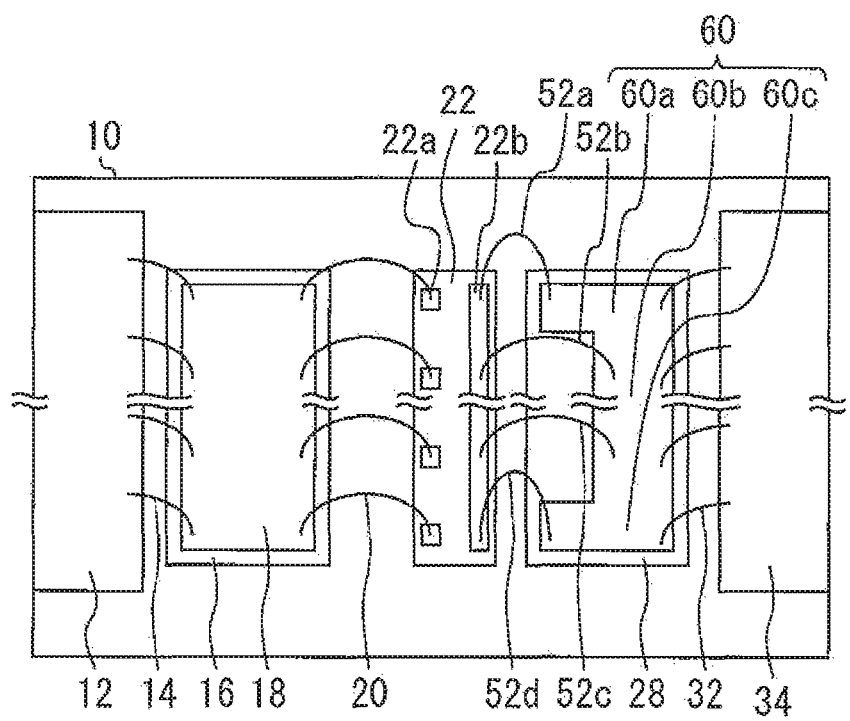
FIG. 21 is a plan view of the amplifier according to the eleventh embodiment.

FIG. 21 is a plan view of the amplifier according to the eleventh embodiment. This amplifier has a number of points of similarity to the amplifier according to the tenth embodiment and will therefore be described mainly with respect to points of difference from the tenth embodiment. The first outer-most bonding wire 52a and the second outer-most bonding wire 52d are higher in loop height than the intermediate bonding wires 52b and 52c. Also, the first outer-most bonding wire 52a and the second outer-most bonding wire 52d are shorter than the intermediate bonding wires 52b and 52c.

In the amplifier according to the eleventh embodiment of the present invention, the currents flowing through the first outer-most bonding wire and the second outer-most bonding wire can be reduced by increasing the loop heights of the first outer-most bonding wire and the second outer-most bonding wire relative to the loop heights of the intermediate bonding wires, as described above with respect to the first embodiment. Also, the first outer-most bonding wire 52a and the second outer-most bonding wire 52d are made shorter than the intermediate bonding wires 52b and 52c, thereby reducing the meltability of the first outer-most bonding wire 52a and the second outer-most bonding wire 52d.

Twelfth Embodiment

Figure 22:
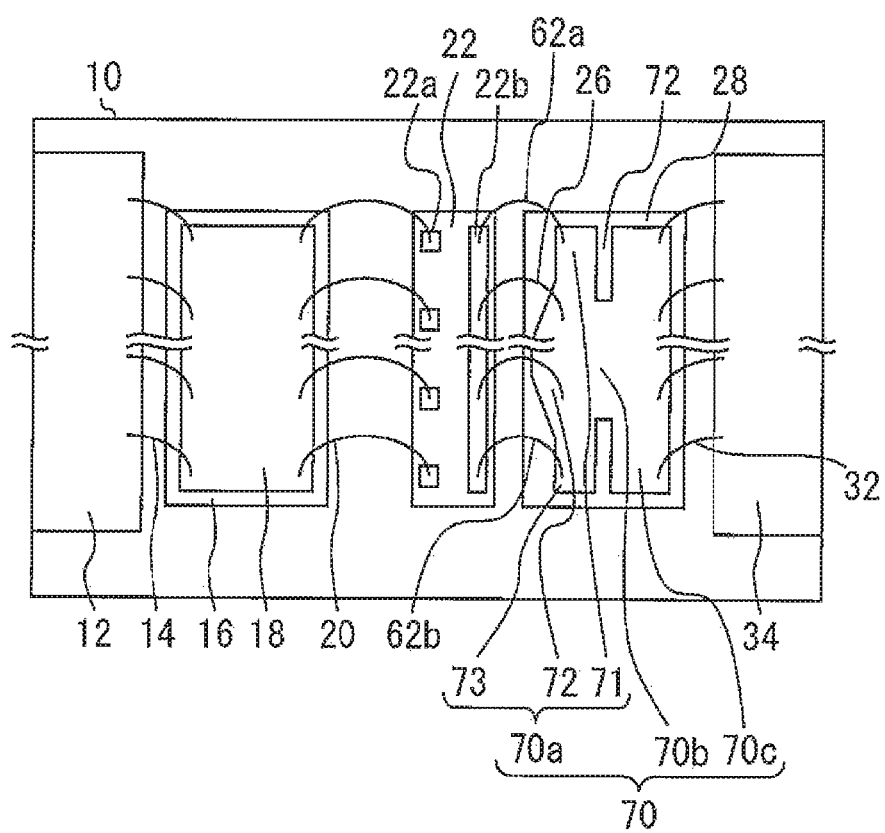
FIG. 22 is a plan view of the amplifier according to the twelfth embodiment.

FIG. 22 is a plan view of the amplifier according to the twelfth embodiment. A plurality of drain bonding wires include a first outer-most bonding wire 62a connected to one of two end portions of the drain pad 22b, a second outer-most bonding wire 62b connected to the other of the two end portions of the drain pad, and intermediate bonding wires 26 interposed between the first outer-most bonding wire 62a and the second outer-most bonding wire 62b. The first outer-most bonding wire 62a, the second outer-most bonding wire 62b and the intermediate bonding wires 26 are equal in length to each other.

A metal pattern 70 is formed on the output matching substrate 28. The metal pattern 70 has a neighboring portion 70a provided on the transistor chip 22 side, an intermediate portion 70b which is adjacent to the neighboring portion 70a and which is reduced in width by slits, and a rear portion 70c which is adjacent to the intermediate portion 70b and to which bonding wires 32 are connected. The neighboring portion 70a includes two end portions 71 and 73 and a central portion 72 interposed between the two end portions 71 and 73. The first outer-most bonding wire 62a and the second outer-most bonding wire 62b are connected to the two end portions 71 and 73, respectively. The intermediate bonding wires 26 are connected to the central portion 72. The central portion 72 is provided in such a position as to be closer to the transistor chip 22 than the two end portions 71 and 73.

The length of a path for the current flowing through the first outer-most bonding wire 62a and the length of a path for the current flowing through the second outer-most bonding wire 62b can be made longer than the lengths of paths for the currents flowing through the intermediate bonding wires 26 by forming slits in the metal pattern 70 without changing each of the lengths of the first outer-most bonding wire 62a and the second outer-most bonding wire 62b. The slits are formed parallel to the lengthwise direction of the drain pad 22b.

The central portion 72 is in such a position as to be closer to the transistor chip 22 than the two end portions 71 and 73. Accordingly, the area of the central portion 72 is larger than the area of the end portion 71 and the area of the end portion 73. Therefore, each of the pattern capacitance of the first outer-most bonding wire 62a at the point of landing on the metal pattern 70 and the pattern capacitance of the second outer-most bonding wire 62b at the point of landing on the metal pattern 70 is smaller than the corresponding capacitance of the intermediate bonding wires 26. The impedances for signals transmitted via the first outer-most bonding wire 62a and the second outer-most bonding wire 62b are thereby increased, thus enabling reducing the currents flowing through these bonding wires.

Thirteenth Embodiment

Figure 23:
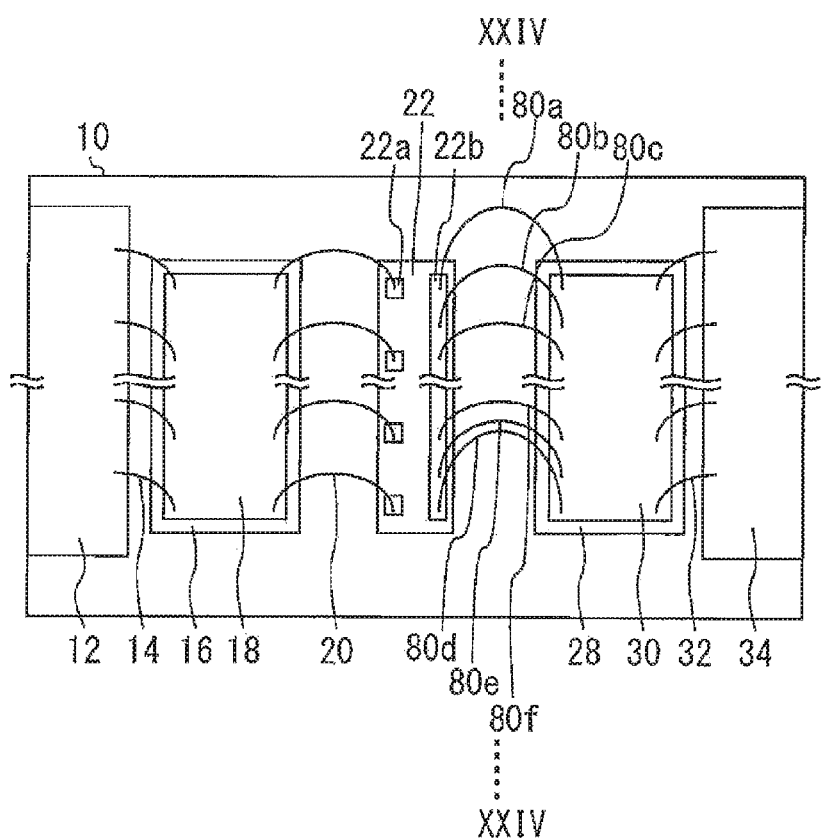
FIG. 23 is a plan view of the amplifier according to the thirteenth embodiment.
Figure 24:
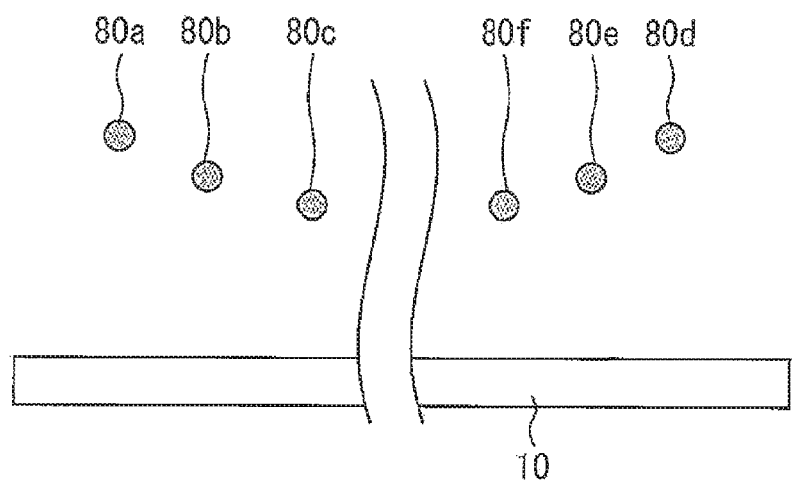
FIG. 24 is a sectional view of the amplifier of FIG. 23.

FIG. 23 is a plan view of the amplifier according to the thirteenth embodiment. A plurality of drain bonding wires 80a, 80b, 80c, 80d, 80e, and 80f are changed in loop height in such a manner that those of them connected closer to the ends of the drain pad 22b are made higher in loop height. FIG. 24 is a sectional view taken along line XXIV-XXIV in FIG. 23. The plurality of drain bonding wires are provided in such a manner that the outermost ones are highest in loop height and the inner ones are successively made lower in loop height.

In the amplifier according to the first embodiment, only the loop heights of the outermost drain bonding wires in the plurality of drain bonding wires are increased, while the other bonding wires, i.e. the intermediate bonding wires, are made uniform in loop height. In that case, the currents through the adjacent bonding wires adjacent to the outer-most drain bonding wires are increased.

In the amplifier according to the thirteenth embodiment, however, current concentration on particular ones of the bonding wires including the adjacent bonding wires can be prevented by changing the loop heights of the plurality of drain bonding wires stepwise as shown in FIG. 24. The currents flowing through the plurality of drain bonding wires can thus be made uniform.

Fourteenth Embodiment

Figure 25:
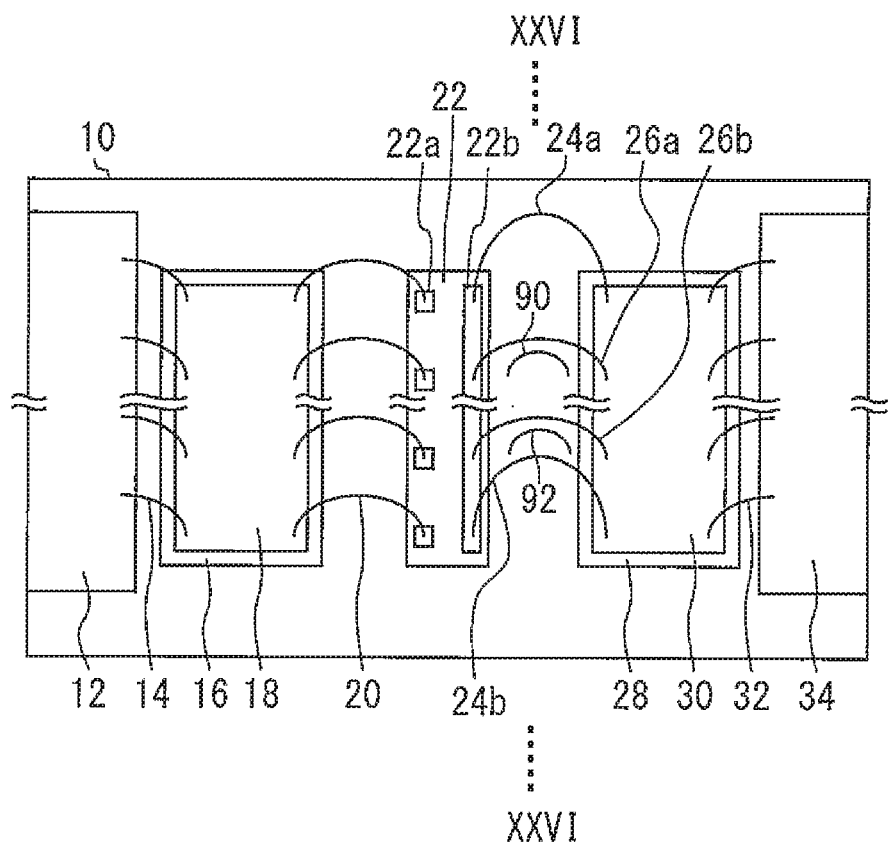
FIG. 25 is a plan view of the amplifier according to the fourteenth embodiment.

FIG. 25 is a plan view of the amplifier according to the fourteenth embodiment. Package bonding wires 90 and 92 having their opposite ends connected to the package 10 are provided. The package bonding wire 90 is positioned between an intermediate bonding wire 26a and the package 10, while the package bonding wire 92 is positioned between an intermediate bonding wire 26b and the package 10. The package bonding wires 90 and 92 have ground potential.

Figure 26:
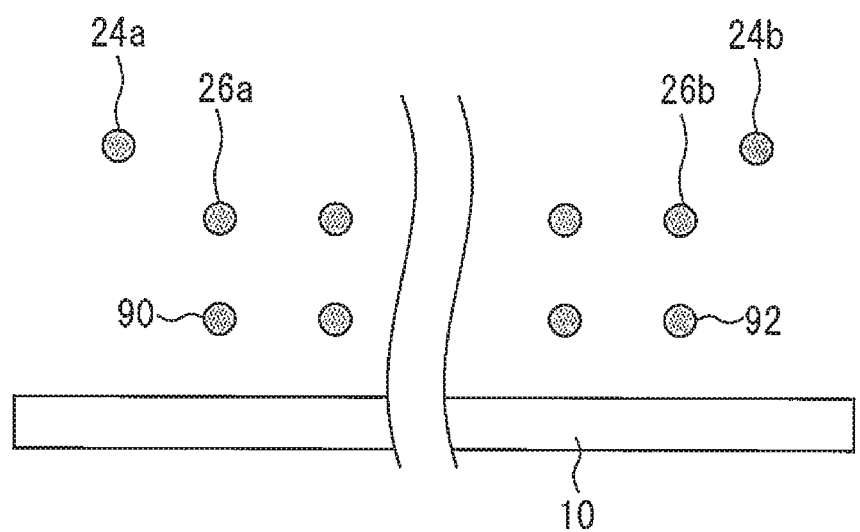
FIG. 26 is a sectional view of the amplifier of FIG. 25.

FIG. 26 is a sectional view taken along XXVI-XXVI in FIG. 25. The package bonding wires 90 and 92 are positioned near the intermediate bonding wires 26a and 26b to concentrate electric fields in the vicinities of the intermediate bonding wires 26a and 26b. As a result, the current through the first outer-most bonding wire 24a and the current through the second outer-most bonding wire 24b can be reduced.

The above-described package bonding wires can be used simultaneously with the technique for changing the loop height stepwise, described with reference to FIGS. 23 and 24.

Fifteenth Embodiment

Figure 27:
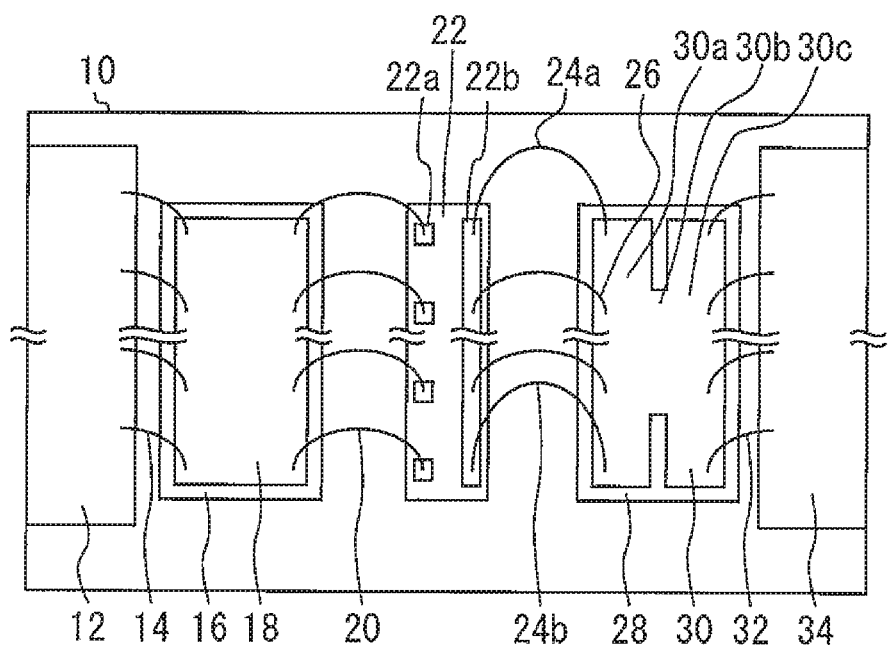
FIG. 27 is a plan view of the amplifier according to the fifteenth embodiment.

FIG. 27 is a plan view of the amplifier according to the fifteenth embodiment. This amplifier will be described mainly with respect to points of difference from the first embodiment. Slits are formed in the metal pattern 30 perpendicularly to the direction of propagation of a signal. The slits are provided parallel to the lengthwise direction of the drain pad 22b.

The metal pattern 30 has a neighboring portion 30a provided on the transistor chip 22 side, an intermediate portion 30b which is adjacent to the neighboring portion 30a and which is reduced in width by the slits, and a rear portion 30c which is adjacent to the intermediate portion 30b and to which bonding wires 32 are connected.

The first outer-most bonding wire 24a and the second outer-most bonding wire 24b are made higher in loop height than the intermediate bonding wires 26. The currents flowing through the bonding wires at the opposite ends can thereby be reduced in comparison with the case where all the drain bonding wires are uniform in height.

Since the first outer-most bonding wire 24a and the second outer-most bonding wire 24b are made higher in loop height than the intermediate bonding wires 26, the length of a path for the current flowing through the first outer-most bonding wire 24a and the length of a path for the current flowing through the second outer-most bonding wire 24b are longer than the lengths of paths for the currents flowing through the intermediate bonding wires 26. In addition, by forming the slits in the metal pattern 30, the length of a path in the metal pattern 30 for the current flowing through the first outer-most bonding wire 24a and the length of a path in the metal pattern 30 for the current flowing through the second outer-most bonding wire 24b are made longer than the lengths of paths in the metal pattern 30 for the currents flowing through the intermediate bonding wires 26.

As a result, the impedances of the current paths through the first outer-most bonding wire 24a and the second outer-most bonding wire 24b are made higher than those of the current paths through the intermediate bonding wires 26, and the current through the first outer-most bonding wire 24a and the current through the second outer-most bonding wire 24b can be reduced.

In the amplifier according to the fifteenth embodiment, as described above, the first outer-most bonding wire 24a and the second outer-most bonding wire 24b are made higher in loop height than the intermediate bonding wires 26 and slits are provided in the metal pattern 30. The current through the first outer-most bonding wire 24a and the current through the second outer-most bonding wire 24b can thereby be sufficiently reduced.

Preferably, in each of the embodiments described above, the lengths of the bonding wires connected to the drain pad 22b are set to 6 mm or less. Certain combinations of the features of the amplifiers according to the embodiments described above may be made and used as appropriate.

For example, according to the present invention, the lengths of the plurality of drain bonding wires connected to the drain pad are made longer than 1 mm and the outer-most bonding wires positioned at the opposite ends in the plurality of drain bonding wires are made longer than the other bonding wires, thus inhibiting melting of the bonding wires.

Obviously many modifications and variations of the present invention are possible in the light of the above teachings. It is therefore to be understood that within the scope of the appended claims the invention may be practiced otherwise than as specifically described.

What is claimed is:

1. An amplifier comprising:
   a package;
   a transistor chip having a gate pad and a drain pad formed elongately, the transistor chip being provided in the package; and
   a plurality of drain bonding wires connected to the drain pad,
   wherein the plurality of drain bonding wires include a first outer-most bonding wire connected to one of two end portions of the drain pad, a second outer-most bonding wire connected to the other of the two end portions of the drain pad, and an intermediate bonding wire interposed between the first outer-most bonding wire and the second outer-most bonding wire;
   each of the plurality of drain bonding wires is longer than 1 mm; and
   the first outer-most bonding wire and the second outer-most bonding wire have loop heights larger than a loop height that the intermediate bonding wire has.

2. The amplifier according to claim 1, wherein the difference in loop height between the first outer-most bonding wire and the intermediate bonding wire is equal to or smaller than 0.8 mm, and the difference in loop height between the second outer-most bonding wire and the intermediate bonding wire is equal to or smaller than 0.8 mm.

3. The amplifier according to claim 1, wherein each of the first outer-most bonding wire and the second outer-most bonding wire is thicker than the intermediate bonding wire.

4. The amplifier according to claim 3, wherein each of the thicknesses of the first outer-most bonding wire and the second outer-most bonding wire is equal to or larger than 25 μm.

5. The amplifier according to claim 1, further comprising:
   a substrate provided in the package; and
   a metal pattern formed on the substrate,
   wherein the plurality of drain bonding wires connect the drain pad and the metal pattern to each other.

6. The amplifier according to claim 5, wherein the length of a path in the metal pattern for a current flowing through the first outer-most bonding wire and the length of a path in the metal pattern for a current flowing through the second outer-most bonding wire are made longer than the length of a path in the metal pattern for a current flowing through the intermediate bonding wire by forming slits in the metal pattern.

7. The amplifier according to claim 1, wherein a package bonding wire having opposite ends connected to the package is provided between the intermediate bonding wire and the package.

8. An amplifier comprising:
a package;
a transistor chip having a gate pad and a drain pad formed elongately, the transistor chip being provided in the package; and
a plurality of drain bonding wires connected to the drain pad,
wherein the plurality of drain bonding wires include a first outer-most bonding wire connected to one of two end portions of the drain pad, a second outer-most bonding wire connected to the other of the two end portions of the drain pad, and an intermediate bonding wire interposed between the first outer-most bonding wire and the second outer-most bonding wire; and
each of the first outer-most bonding wire and the second outer-most bonding wire is thicker than the intermediate bonding wire.

9. An amplifier comprising:
a package;
a transistor chip having a gate pad and a drain pad formed elongately, the transistor chip being provided in the package; and
a plurality of drain bonding wires connected to the drain pad,
wherein the plurality of drain bonding wires include a plurality of first outer-most bonding wires connected to one of two end portions of the drain pad so that their landing points are tangent to each other, a plurality of second outer-most bonding wires connected to the other of the two end portions of the drain pad so that their landing points are tangent to each other, and an intermediate bonding wire interposed between the plurality of first outer-most bonding wires and the plurality of second outer-most bonding wires;
the plurality of first outer-most bonding wires differ in loop height from each other; and
the plurality of second outer-most bonding wires differ in loop height from each other.

10. An amplifier comprising:
a package;
a transistor chip having a gate pad and a drain pad formed elongately, the transistor chip being provided in the package; and
a plurality of drain bonding wires connected to the drain pad,
wherein the plurality of drain bonding wires are provided so that the drain bonding wire density is higher at two end portions of the drain pad than at an intermediate portion located between the two end portions of the drain pad.

11. The amplifier according to claim 10, wherein the interval between the drain bonding wires in terms of center-to-center distance between the bonding wires is 0.03 to 1 mm at each of the two end portions of the drain pad.

12. The amplifier according to claim 10, wherein a first outer-most bonding wire connected to the one of the two end portions and a second outer-most bonding wire connected to the other of the two end portions are higher in loop height than a plurality of intermediate bonding wires connected to the intermediate portion.

13. The amplifier according to claim 10, wherein a plurality of first outer-most bonding wires connected to the one of the two end portions and a plurality of second outer-most bonding wires connected to the other of the two end portions are connected to the drain pad in a staggered fashion.

14. The amplifier according to claim 13, wherein the drain bonding wires positioned at opposite ends in the plurality of drain bonding wires are higher in loop height than the other drain bonding wires.

15. An amplifier comprising:
a package;
a transistor chip having a gate pad and a drain pad formed elongately, the transistor chip being provided in the package; and
a plurality of drain bonding wires connected to the drain pad,
wherein the plurality of drain bonding wires include two first outer-most bonding wires connected to one of two end portions of the drain pad, two second outer-most bonding wires connected to the other of the two end portions of the drain pad, and an intermediate bonding wire interposed between the two first outer-most bonding wires and the two second outer-most bonding wires;
the two first outer-most bonding wires intersect each other as viewed in plan; and
the two second outer-most bonding wires intersect each other as viewed in plan.

16. The amplifier according to claim 15, further comprising:
a substrate provided in the package; and
a metal pattern formed on the substrate,
wherein the plurality of drain bonding wires connect the drain pad and the metal pattern to each other.

17. An amplifier comprising:
a package;
a transistor chip having a gate pad and a drain pad formed elongately, the transistor chip being provided in the package; and
a plurality of drain bonding wires connected to the drain pad,
wherein the plurality of drain bonding wires include a first outer-most bonding wire connected to one of two end portions of the drain pad, a second outer-most bonding wire connected to the other of the two end portions of the drain pad, and an intermediate bonding wire interposed between the first outer-most bonding wire and the second outer-most bonding wire; and
each of the first outer-most bonding wire and the second outer-most bonding wire is shorter than the intermediate bonding wire.

18. The amplifier according to claim 17, wherein the first outer-most bonding wire and the second outer-most bonding wire are higher in loop height than the intermediate bonding wire.

19. The amplifier according to claim 17, further comprising:
a substrate provided in the package; and
a metal pattern formed on the substrate,
wherein the drain pad has an intermediate portion interposed between the two end portions;
the metal pattern has a first portion opposed to the one of the two end portions, a second portion opposed to the intermediate portion, and a third portion opposed to the other of the two end portions;
each of the distance between the one of the two end portions and the first portion and the distance between the other of the two end portions and the third portion is smaller than the distance between the intermediate portion and the second portion;

the first outer-most bonding wire is connected to the first portion;

the intermediate bonding wire is connected to the second portion; and the second outer-most bonding wire is connected to the third portion.

20. An amplifier comprising:

a package;

a transistor chip having a gate pad and a drain pad formed elongately, the transistor chip being provided in the package;

a plurality of drain bonding wires connected to the drain pad;

a substrate provided in the package; and a metal pattern formed on the substrate, wherein the plurality of drain bonding wires include a first outer-most bonding wire connected to one of two end portions of the drain pad, a second outer-most bonding wire connected to the other of the two end portions of the drain pad, and an intermediate bonding wire interposed between the first outer-most bonding wire and the second outer-most bonding wire;

the length of a path for a current flowing through the first outer-most bonding wire and the length of a path for a current flowing through the second outer-most bonding wire are made longer than the length of a path for a current flowing through the intermediate bonding wire by forming slits in the metal pattern; and a central portion of the metal pattern to which the intermediate bonding wire is connected is in such a position as to be closer to the transistor chip than two end portions of the metal pattern to which the first outer-most bonding wire and the second outer-most bonding wire are connected.

21. The amplifier according to claim 20, wherein the slits are provided parallel to the lengthwise direction of the drain pad.

22. An amplifier comprising:

a package;

a transistor chip having a gate pad and a drain pad formed elongately, the transistor chip being provided in the package; and a plurality of drain bonding wires connected to the drain pad, wherein ones of the plurality of drain bonding wires connected closer to the ends of the drain pad are made higher in loop height.

23. An amplifier comprising:

a package;

a transistor chip having a gate pad and a drain pad formed elongately, the transistor chip being provided in the package;

a plurality of drain bonding wires connected to the drain pad; and a package bonding wire having opposite ends connected to the package, wherein the plurality of drain bonding wires include a first outer-most bonding wire connected to one of two end portions of the drain pad, a second outer-most bonding wire connected to the other of the two end portions of the drain pad, and an intermediate bonding wire interposed between the first outer-most bonding wire and the second outer-most bonding wire; and the package bonding wire is positioned between the intermediate bonding wire and the package.

24. An amplifier comprising:

a package;

a transistor chip having a gate pad and a drain pad formed elongately, the transistor chip being provided in the package; and a plurality of drain bonding wires connected to the drain pad, wherein the plurality of drain bonding wires includes outer-most bonding wires connected to the two end portions of the drains pad, and the plurality of drain bonding wires are configured to prevent the outer-most bonding wires from melting.

* * * * *